(12) United States Patent
Wang

(10) Patent No.: US 6,934,206 B2
(45) Date of Patent: Aug. 23, 2005

(54) TEST STRUCTURE FOR DETECTING BRIDGING OF DRAM CAPACITORS

(75) Inventor: Chien-Jung Wang, Kaohsiung (TW)

(73) Assignee: Taiwan Semiconductor Manufacturing Company, Hsinchu (TW)

(*) Notice: Subject to any disclaimer, the term of this patent is extended or adjusted under 35 U.S.C. 154(b) by 159 days.

(21) Appl. No.: 10/626,778

(22) Filed: Jul. 24, 2003

(65) Prior Publication Data

US 2004/0153275 A1 Aug. 5, 2004

Related U.S. Application Data

(62) Division of application No. 09/835,024, filed on Apr. 16, 2001, now Pat. No. 6,617,180.

(51) Int. Cl.[7] .................................................. G11C 7/00
(52) U.S. Cl. ........................................ 365/201; 365/223
(58) Field of Search ............................. 365/189.01, 200, 365/201, 208, 212, 214, 223; 257/E25.004

(56) References Cited

U.S. PATENT DOCUMENTS

| | | | | |
|---|---|---|---|---|
| 5,377,152 A | * | 12/1994 | Kushiyama et al. | ........ 365/210 |
| 6,046,946 A | * | 4/2000 | Nadeau-Dostie et al. | ... 365/201 |
| 6,191,985 B1 | * | 2/2001 | Gratz et al. | ................. 365/200 |
| 6,208,572 B1 | * | 3/2001 | Adams et al. | .............. 365/201 |
| 6,388,927 B1 | * | 5/2002 | Churchill et al. | ........... 365/201 |

* cited by examiner

*Primary Examiner*—George Fourson
*Assistant Examiner*—Brook Kebede
(74) *Attorney, Agent, or Firm*—Thomas, Kayden, Horstemeyer & Risley

(57) ABSTRACT

A new method is provided for the interconnection of bit lines in the test structure. The invention provides for the creation of a cross comb bit line design in the test structure which allows for the detection and identification of diagonal or horizontal bridging between two identifiable capacitors of DRAM structures.

7 Claims, 5 Drawing Sheets

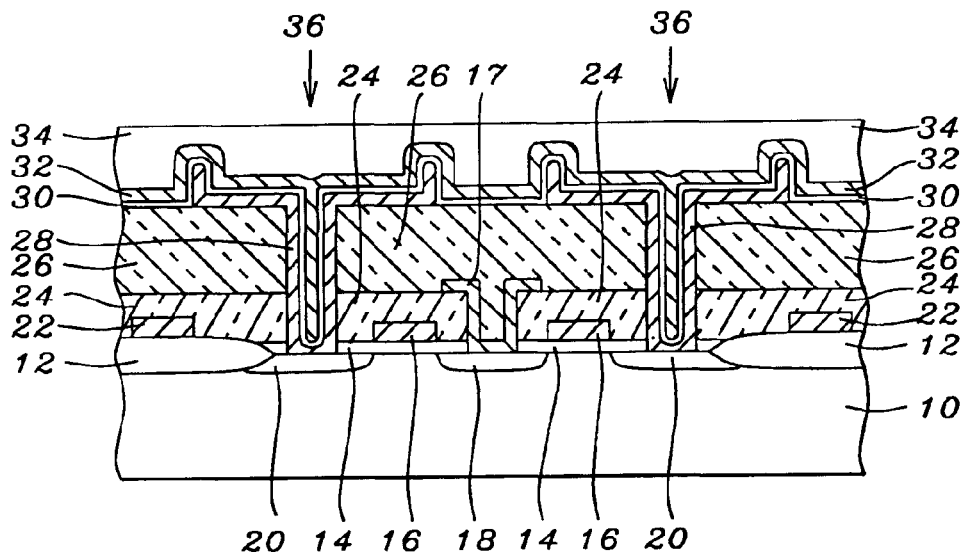
FIG. 1 – Prior Art
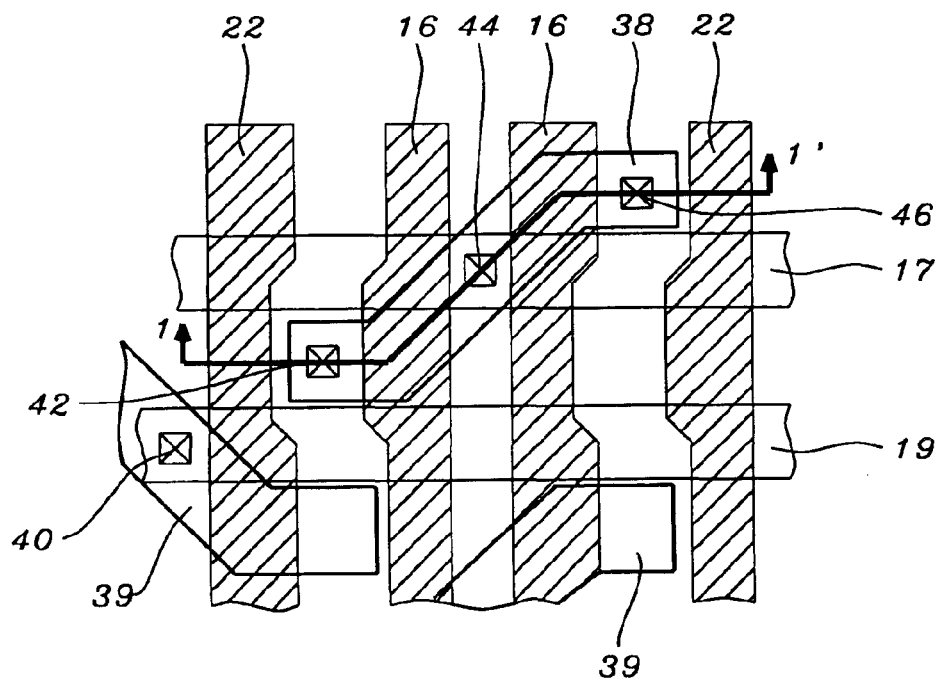
FIG. 2 – Prior Art

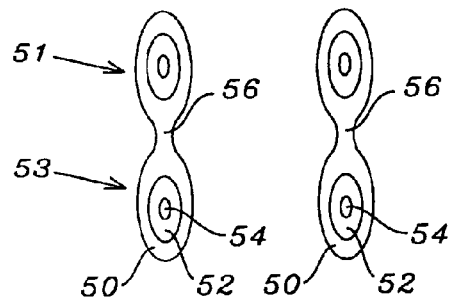
FIG. 3a - Prior Art
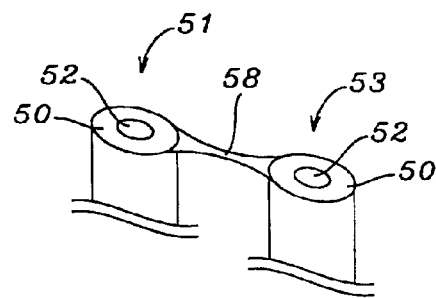
FIG. 3b - Prior Art
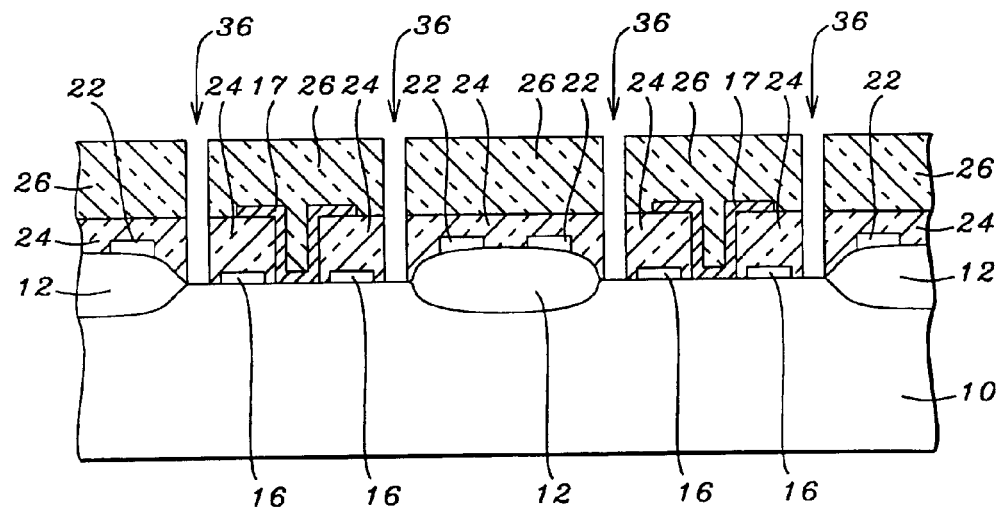
FIG. 4 - Prior Art

TEST STRUCTURE FOR DETECTING BRIDGING OF DRAM CAPACITORS

This is a division of patent application Ser. No. 09/835,024, filing date Apr. 16, 2001, now U.S. Pat. No. 6,617,180, Novel Test Structure For Detecting Bridging Of Dram Capacitors, assigned to the same assignee as the present invention.

BACKGROUND OF THE INVENTION (1) Field of the Invention

The invention relates to the fabrication of integrated circuit devices, and more particularly, to a method to detect and identify diagonal or horizontal bridging between two DRAM capacitors.

(2) Description of the Prior Art

Semiconductors typically comprise numerous and complex semiconductor devices in addition to electrical components such as capacitors, resistors, diodes and the like that function in cooperation with the semiconductor devices. The art has long known numerous interacting technologies and numerous semiconductor materials that are used to create semiconductor components. Applied for this purpose are processing steps such as depositing layers of material, the shaping of deposited layers by for instance creating openings or interconnect lines in conductive layers, creating regions of different conductivity by means of ion impurity implantation, creating surface regions of low-sheet resistivity for optimum connectivity, etc. For many of these processing steps optimum processing conditions are required. This not only for the creation of the desired device feature but to in addition assure that the semiconductor material that is used for the process is deposited in a controlled manner and without causing undesirable side effects, such as the occurrence of salicided stringers during the process of salicidation. One of the side-effects of a semiconductor processing steps is the diffusion of deposited materials into surrounding layers of dielectric, for instance the diffusion of a deposited layer of copper into surrounding Intra Level Dielectric. Methods are known in the industry to prevent such diffusion such as for instant the application of a barrier layer across the trench or opening into which the copper is deposited. The material of the barrier layer is selected such that the copper is prevented from diffusion from the opening into which the copper is deposited. Multiple techniques are further known to prevent undesired ion diffusion. As an example of this can be cited the creation of Lightly Doped Diffusion (LDD) regions adjacent to gate electrodes, which eliminate the effects of intense concentrations of electromagnetic fields in the interface between the gate electrode and the surface of the substrate over which the gate electrode is created. Metals, which have been deposited for the creation of interconnecting lines or contact plugs, is particularly prone to diffusion. Metal diffusion most readily results in disturbing the lattice structure of the surrounding semiconductor material, most particularly the silicon of the silicon substrate over which semiconductor devices and features are created. Further processing, which frequently requires high temperature processing, can further aggravate the crystalline disturbance, modifying relatively simple and concentrated imperfections to the level of crystalline disturbances that may have a serious negative effect on overall devices performance and reliability. Since these crystalline imperfections are in most cases not observable during the process of creating semiconductor devices, the device or a sub-component of the device must be tested either at intermittent points during the processing cycle or after the processing cycle has reached a phase where the process can be advantageously interrupted for device testing. In addition, testing may provide test results which are difficult to correlate with actual deficiencies in the semiconductor structure, which further makes it difficult to correlate particular processing steps with the results of the testing and with particular imperfections in the created device or device features. In view of the frequently extended period of time that is required to create more complex semiconductor devices, it becomes even more urgent to establish clear testing procedures that clearly identify particular and well identifiable device deficiencies and that further correlate the testing with processing steps that most likely are the cause of the device deficiencies.

The industry has over the years used a number of techniques to control the frequently extended processing sequence that is required to create semiconductor devices. It is unacceptable to create these devices in one uninterrupted processing stream without validating the process of the device creation at particular points before the device processing sequence is completed. This approach has been implemented by processing multiple wafers in one identical processing stream and by extracting at critical points within the processing stream one or more of these wafers for testing. It is clear that this approach is not commensurate with maximizing semiconductor device throughout, since the wafers that are extracted in this manner are frequently not re-joined with the main stream of wafer processing. Also, it is difficult to make the processing increment between the points where wafers are extracted small enough so that individual processing steps can be isolated and the therefrom potentially resulting device defects can be identified. If for instance two processing steps are applied, such as the deposition and etching of a layer followed by annealing at high temperatures the etched layer of semiconductor material, the heating step may be the essential cause and contributor to the device defect that is identified. The testing however at this stage does not necessarily identify the heating step as being the cause of the device defect. The process is further complicated by even minute variations in processing conditions, for instance variations in density or energy of ion impurity implantations or small variations in the thickness of a deposited layer of semiconductor material. Further complicating the process of device testing is the fact that semiconductor wafers have been increasing in size, this in order to create more semiconductor chips from one wafer thus reducing the cost per device.

Imperfections in a crystalline structure are most frequently created in regions of high stress within the structure or in regions where impurities have been introduced into the molecular structure of the crystal. Frequently these imperfections can be eliminated by high temperature annealing even though, if improperly applied, high temperature annealing can further aggravate the crystalline imperfection. High stress regions for instance are sharp transitions of one surface into another such as at the bottom of a trench that is created for Shallow Trench Isolation regions or trenches created for the creation of interconnect lines. Special processing steps are frequently required to eliminate these sharp transitions or to create, for instance, trench openings that have nearly vertical sidewalls.

Semiconductor devices and the functions that are performed by these devices can generally be divided into functions of data manipulation or logic functions and functions of data storage. Functions of data manipulation are mostly related to digital data manipulation but can also comprise functions of analog data manipulation. Functions of data storage provide data retention capabilities that are performed by semiconductor memory devices. Two types of memory devices can be identified, that is memory functions that retain data in storage cells from which the data can only be read (Read Only Memories or ROM's) and memory functions whereby the data cannot only be read but can also be altered (Random Access Memories or RAM's).

Random Access Memories memory devices are created using a number of different approaches. This results in creating different types of RAM devices such as the Dynamic RAM (DRAM) devices, which use capacitors as the storage medium and which are therefore, due to the non-permanent nature of the capacitive storage, periodically refreshed, and Static RAM (SRAM) devices, which depend on the presence of a power source for the retention of the stored data. DRAM memories offer advantages of economy of construction and of relatively high storage capabilities and have therefore attracted most of the attention in the semiconductor industry.

Capacitors are critical components of RAM devices and can be divided in a number of different types of capacitors, dependent on and reflecting types of construction of the capacitor and the materials that are used in the construction of the capacitors. Known for instance are Metal Oxide Metal (MOM) capacitors and types of capacitors that are identified based on the materials that are used for the electrodes of the capacitors, such as polysilicon-silicon, polysilicon-polysilicon of metal-metal capacitors.

Capacitors that are an integral part of RAM devices can further be identified by the geometry or construction of the capacitor. One such construction provides a stacked capacitor. The memory cell under this arrangement comprises one transfer gate transistor and one stacked type capacitor. The transfer gate transistor comprises a pair of source/drain regions formed in a surface of a silicon substrate and a gate electrode (word line) that is formed on the surface of the silicon substrate with an insulation layer interposed therebetween. The stacked type capacitor comprises an underlying electrode (storage electrode) which extends from a position above the gate electrode to a position above a field isolation film, a part of the capacitor is connected to one of the source/drain regions of the gate electrode. A dielectric layer is formed on a surface of the underlying electrode and an upper electrode (cell plate) is formed on a surface of a dielectric layer. A bit line is formed on the capacitor with an interlayer insulation layer interposed therebetween, the bit line is connected to the other source/drain regions of the transfer gate transistor through a bit line contact portion. The stacked type capacitor is characterized in that capacitance of a capacitor is assured by providing the main part of the capacitor extending above the gate electrode and the field isolation film, this to increase an area where the electrodes of the capacitor are opposed to each other.

Another arrangement of a memory cell comprises a so-called cylindrical stacked type capacitor. A transfer gate transistor comprises a gate electrode (word line) with a periphery that is covered with an insulation layer. A word line with a periphery that is covered with the insulation layer is formed on the surface of a shield electrode, which is formed on a surface of a silicon substrate with a shield gate insulation film interposed therebetween. An underlying electrode of the capacitor comprises a base portion (formed on a surface of an insulation layer covering surfaces of the gate electrode) and a word line with a cylindrical portion extending vertically and upwardly from the surface of the base portion in the form of a cylinder. A dielectric layer and an upper electrode are sequentially deposited on a surface of a lower electrode. The cylindrical portion of the capacitor can be used as a region for storing electric charges, enabling the capacitance of the capacitor to be increased without increasing the plane of the capacitor.

The invention addresses a testing procedure that is applied during the creation of DRAM devices, and more specifically addresses the presence of interconnects or bridging that may occur between adjacent capacitor openings. This bridging is an issue that, with the decreasing dimensions of devices and device features, takes on more urgency since the openings that must be created for the creation of capacitors are very closely spaced.

For purposes of understanding, the prior art cross section of FIG. 1 is first discussed. Shown in FIG. 1 is a cross section of a DRAM cell having two capacitors, the elements that are shown in cross section in FIG. 1 are the following:

10, the semiconductor substrate in and on the surface of which the DRAM cell is created 12, the regions of field oxide that electrically isolated the DRAM cell 14, a layer of pad oxide created over the active surface regions of substrate 10

16, the adjacent polysilicon gate electrodes (Metal Oxide Field Effect Transistors or MOSFET's), gate electrodes 16 form the word lines of the DRAM cell 17, the bit line of the DRAM cell 18, the (common) drain of the two gate electrodes 16

20, the two source regions of the gate electrodes 16

22, word lines overlying the field oxide regions 12, these word lines 22 are connected to other, surrounding MOSFET devices that are located in an array above and below the plane of the cross cut that is shown in FIG. 1

24, a first layer of insulation typically comprising Inter Polysilicon (IPO)

26, a second layer of insulation typically comprising Inter Polysilicon (IPO)

28, the first or lower electrodes of the capacitors of the DRAM cell 30, the dielectric of the capacitors of the DRAM cell 32, the second or upper electrode of the capacitors of the DRAM cell 34, a layer of insulation of Inter Level Dielectric that protects the DRAM cell, and 36, the two stacked capacitors of the DRAM cell.

The first or lower electrodes 28 of the two capacitors 36 contact the source regions 20 of the adjacent gate electrodes 16, bit line 17 is connected to the common drain 18 of the gate electrodes 16. Typically deposited over layer 34 of ILD is a layer of metal (not shown) that is patterned and etched to further interconnect the DRAM cell as a first layer of metal. Prior to the deposition of this layer of metal openings are created through layer 34 in order to connect the layer of metal to the capacitors of the DRAM cell.

For purposes of better understanding, a top view of the DRAM cell is shown in FIG. 1. Key to this understanding is the realization that the cross section that is shown in FIG. 1 has been taken along the line 1–1' of FIG. 2. Further highlighted in FIG. 2 are:

16, the adjacent polysilicon gate electrodes, which form the word lines of the DRAM cell 17, the bit line of the DRAM cell 19, the bit line of an adjacent DRAM cell (not shown in FIG. 1)

22, word lines overlying the field oxide regions 12

38, the active region in the surface of substrate 10 over which the polysilicon gate electrodes 16 and the storage capacitors 36 are created as shown in cross section in FIG. 1

39, two adjacent active regions (not shown in FIG. 1)

40, which is a contact region to an adjacent capacitor (not shown in FIG. 1) in an adjacent active region 39

44, which is the contact region of the bit line 17 of the two gate electrodes 16

42 and 46, which are the contact regions of the capacitors 36 to the two source regions 20 of the two gate electrodes 16.

The invention provides a new test methodology for the testing of DRAM cells and more specifically for the detection of bridging that can occur between adjacent DRAM capacitors.

U.S. Pat. No. 6,028,324 (Su et al.), U.S. Pat. No. 5,977,558 (Lee), U.S. Pat. No. 5,872,018 (Lee), U.S. Pat. No. 5,576,223 (Zeininger et al.) show related test structures.

SUMMARY OF THE INVENTION

A principle objective of the invention is to provide a method of determining bridging between adjacent capacitors of a DRAM cell.

Another objective of the invention is to provide a method of determining bridging between adjacent capacitors of a DRAM cell whereby this method allows for differentiating between horizontal bridging and diagonal bridging between adjacent capacitors.

In accordance with the objectives of the invention a new method is provided for the interconnection of bit lines in the test structure. The invention provides for the creation of a cross comb bit line design in the test structure which allows for the detection and identification of diagonal or horizontal bridging between two identifiable capacitors of DRAM structures.

BRIEF DESCRIPTION OF THE DRAWINGS

FIG. 1 is a cross section of a portion of a stacked capacitor DRAM cell having a buried bit line.

FIG. 2 is a top view of a portion of a stacked capacitor DRAM cell having a buried bit line.

FIGS. 3a and 3b show a simplified top view of a portion of a stacked DRAM cell tubular capacitor.

FIG. 4 is a simplified cross section of a conventional DRAM cell with tubular capacitors.

DESCRIPTION OF THE PREFERRED EMBODIMENTS

Figure 5:
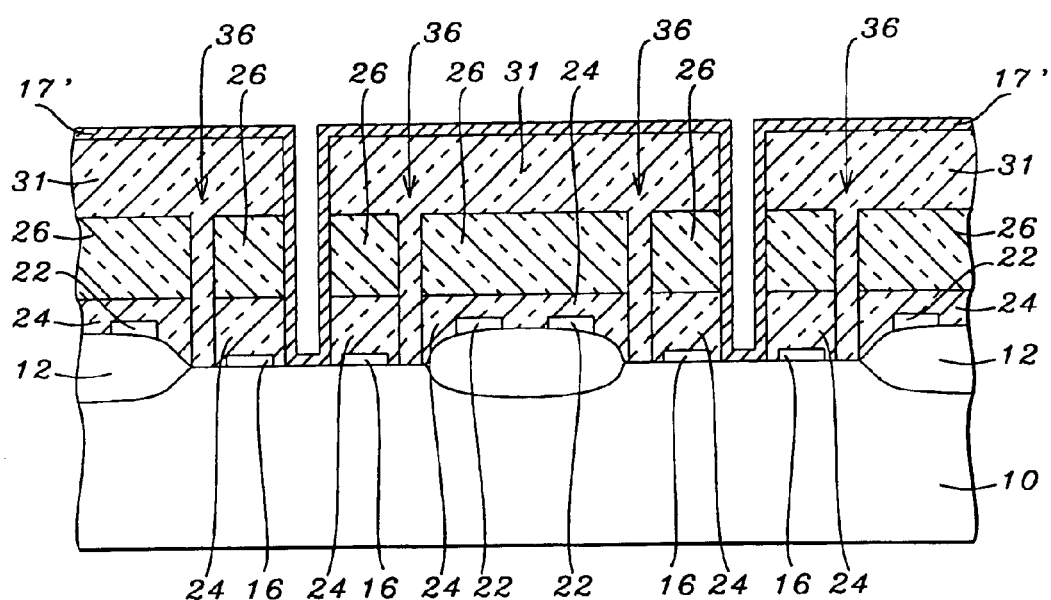
FIG. 5 is a schematic presentation of the extension or modification of a DRAM cell in accordance with the invention.

The concept of horizontal versus diagonal bridging between adjacent capacitors is explained using FIG. 3. Bridging between adjacent capacitors of a DRAM cell that occurs in a direction which is in the direction of the bit lines 16 is considered horizontal bridging. Bridging between adjacent capacitors of a DRAM cell that occurs in a direction that is under an angle of about 45 degrees with the direction of the bit lines 16 is considered diagonal bridging.

Current practice for the identification of bridging between adjacent capacitors uses input frequency to calculate the DRAM capacitance at intermediate points within the cycle of the creation of the capacitors. This method provides information that identifies whether bridging did or did not occur without however providing additional detail regarding the nature of the bridging, that is whether horizontal bridging or diagonal occurred. This limits the value of the test results since, in order to implement methods to reduce or eliminate bridging it is important to be able to identify the nature of the bridging that is being detected. The invention provides a method that allows for not only identifying the fact that bridging occurs but further allows for differentiation between horizontal bridging and diagonal bridging.

This is further highlighted in FIGS. 3a and 3b. FIG. 3a shows a top view of tubular capacitors of a DRAM cell, that is two the upper orifices of two adjacent capacitors 51 and 53. The lower electrode 50 and the dielectric 52 have been deposited, opening 54 remains to be filled with the upper electrode (not shown) of the capacitor. The horizontal bridging that occurs between adjacent capacitors is highlighted with 56. FIG. 3b shows a three dimensional view of diagonal bridging 58 between two adjacent capacitors 51 and 53.

The cross section of a DRAM cell that is shown in FIG. 4 is a conventional DRAM cell, the cross section of FIG. 4 is shown at this time so that the specially created interconnect network of the invention can be more readily introduced at a later time. The elements that have been highlighted in the cross section that is shown in FIG. 4 have previously been highlighted under FIG. 1 and do therefore not need to be further addressed at this time.

Starting essentially from the standard DRAM cell that is shown in cross section in FIG. 4, the invention creates a special designed interconnect network for an array of DRAM cells that are further used to differentiate between horizontal and diagonal leakage between tubular capacitors of the DRAM cells. FIG. 5 specifically addresses the modification to an actual DRAM cell that is provided by the invention.

Not shown in FIG. 5 are, for reasons of simplicity and since that does not contribute to a further understanding of the invention, the three components of lower electrode, dielectric and upper electrode of the capacitors 36 of the DRAM cell.

Shown in the cross section of FIG. 5 are the well-known components that comprise a DRAM cell. A notable difference however between the cross section of FIG. 4, which represents a conventional DRAM cell array, and the cross section that is shown in FIG. 5, which represents a modified DRAM cell array, is that the bit lines 17 are no longer buried bit lines but have been extended to be available as bit lines 17' on the surface of a layer 31 of dielectric. It must thereby further be emphasized that the bit lines 17' of FIG. 5 are not the conventional bit lines 17 as shown in FIG. 4. This will become clear from the following explanation.

Figure 6:
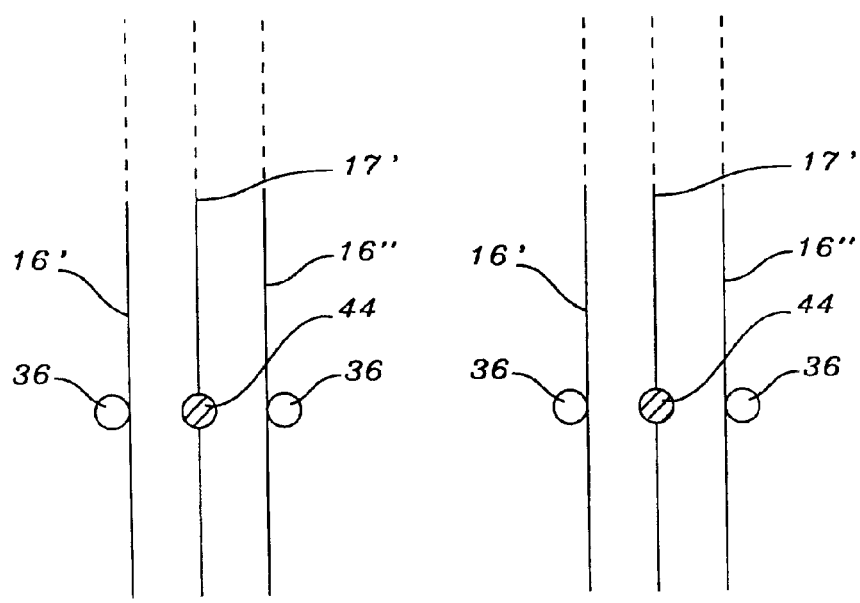
FIG. 6 is a top view of the interconnect scheme of the invention using the same symbols as indicated in the schematic presentation (FIG. 5) of the basic elements of a DRAM cell.

FIG. 6 shows a top view of a simplified representation of the DRAM cell array that is shown in cross section on FIG. 5. The main reason for showing this top view is to introduce the symbols that are used for the balance of the specifications. These symbols show the operative elements of a DRAM cell. These elements can be directly derived from the cross section of FIG. 5, as follow:

16' and 16", word lines of an array of modified DRAM cell of the invention

17', bit line of an array of modified DRAM cell of the invention 36, the capacitors of an array of modified DRAM cell of the invention 44, the contact region of the bit lines of an array of modified DRAM cell of the invention.

With the symbols that are presented in FIG. 6 it must in addition be stated that:

bit lines are always in contact with a contact region, such as contact region 44 in FIG. 6 capacitors that are shown as open circles are not charged bit lines and word line may or may not be connected to a voltage the array of modified DRAM cell of the invention provides for dummy bit lines in addition to active bit lines.

Figure 7:
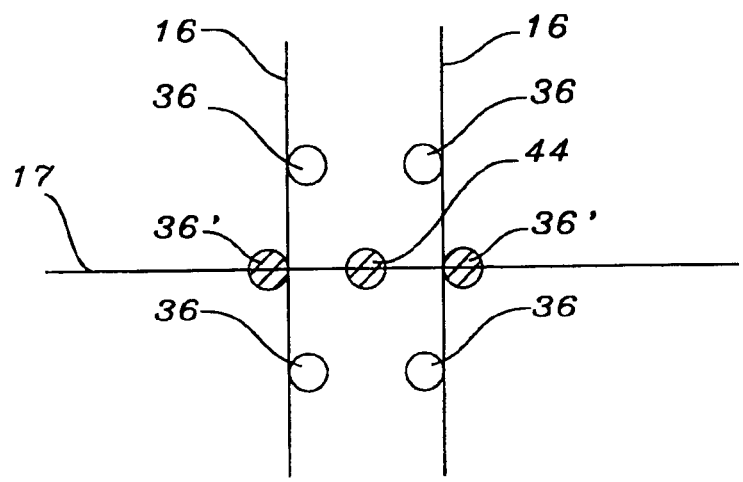
FIG. 7 shows a top view of a small number of the elements of an array of a standard DRAM cell.

FIG. 7 shows a top view of a small number of the elements of an array of a standard DRAM cell, the numbers and symbols that are used in FIG. 7 have previously been introduced.

To be observed from FIG. 7 is the following:

if a voltage of for instance 2 volts is introduced on the word line 16 and a voltage is introduced on the bit line 17, the capacitors that surround the bit line are charged. This is shown with capacitors 36' in FIG. 7 capacitors 36, which are provided with a word line but are not provided with a bit line, cannot be charged if a voltage of 2.5 volts is introduced on the bit line 17, charging capacitors 36' but providing no charge to capacitors 36, and a voltage of 2.0 volts is introduced on the word lines 16, it is clear that there is a difference in voltage between the (charged) capacitors 36' and the (not charged) capacitors 36. If under those conditions of bias there is therefore observed a current flowing from capacitors 36' to 36, it must be concluded that there is a path of conductivity between these capacitors. This path of conductivity is the bridging, in this case diagonal bridging, between adjacent capacitors 36 and 36'. By therefore applying these conditions of voltage and by measuring if a current is observed flowing from capacitors 36 (to for instance ground), the conclusion must be made that diagonal bridging is present if such a current is measured.

The top view that is shown in FIG. 7 represents, as indicated, a small section of a standard DRAM array and will at a later time be recognized as being part of a larger top view, the larger top view more realistically representing an actual DRAM array.

Figure 8:
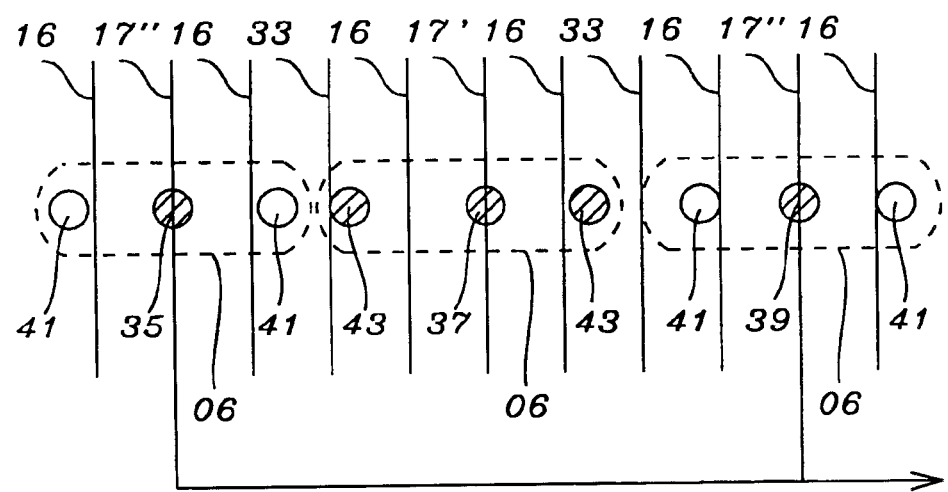
FIG. 8 shows a top view of a small section of the modified DRAM cell that is representative of the cross section shown in FIG. 5.

FIG. 8 shows a top view of a small section of the modified DRAM cell that is representative of the cross section shown in FIG. 5. To avoid confusion, the various elements of the top view of FIG. 8 have been divided into sub-sections 06 whereby each subsection 06 is, as far as elements contained within that subsection, identical to the top view shown in FIG. 6. In addition are shown in FIG. 8 the lines 33, which are dummy bit lines that further fulfill no function in the testing scheme of the invention. Some of the basic premises that apply to the top view of FIG. 8 are the same as those indicated for FIG. 7, that is:

if a voltage of for instance 2 volts is introduced on the word line and a voltage of 2.5 volts is introduced on the bit line, the capacitors that surround the bit line are charged. This is shown with capacitors 43 in FIG. 7. Bit lie 17' is the additional bit line created by the invention (see FIG. 5) and is connected to 2.5 volts, lines 16 surrounding bit line 17' are connected to 2.0 volts resulting in capacitors 43 being charged dummy bit lines 33 are, as previously stated, not further connected and therefore play no role in the scheme of the invention all word lines 16 are connected to 2.0 volts, since however not all bit lines are not connected to a voltage the capacitors 41 will not be charged since capacitors 43 are charged there is a voltage difference between these capacitors and adjacent capacitors 41. If therefore a current can be observed to flow as a consequence of this voltage difference, it must again be decided that there is a conductive path between adjacent capacitors in a horizontal direction. This conformation of current between adjacent capacitors can be provided by connecting bit lines 17" to a lower voltage, such as ground, and measuring any current that flows from capacitors 43 to adjacent capacitors 41.

Keeping in mind the above explanations that have been provided with the help of FIGS. 7 and 8, a larger top view of a conventional DRAM cell and a DRAM cell that has been modified in accordance with the invention can now be understood. This larger top view is shown in FIG. 9.

Figure 9:
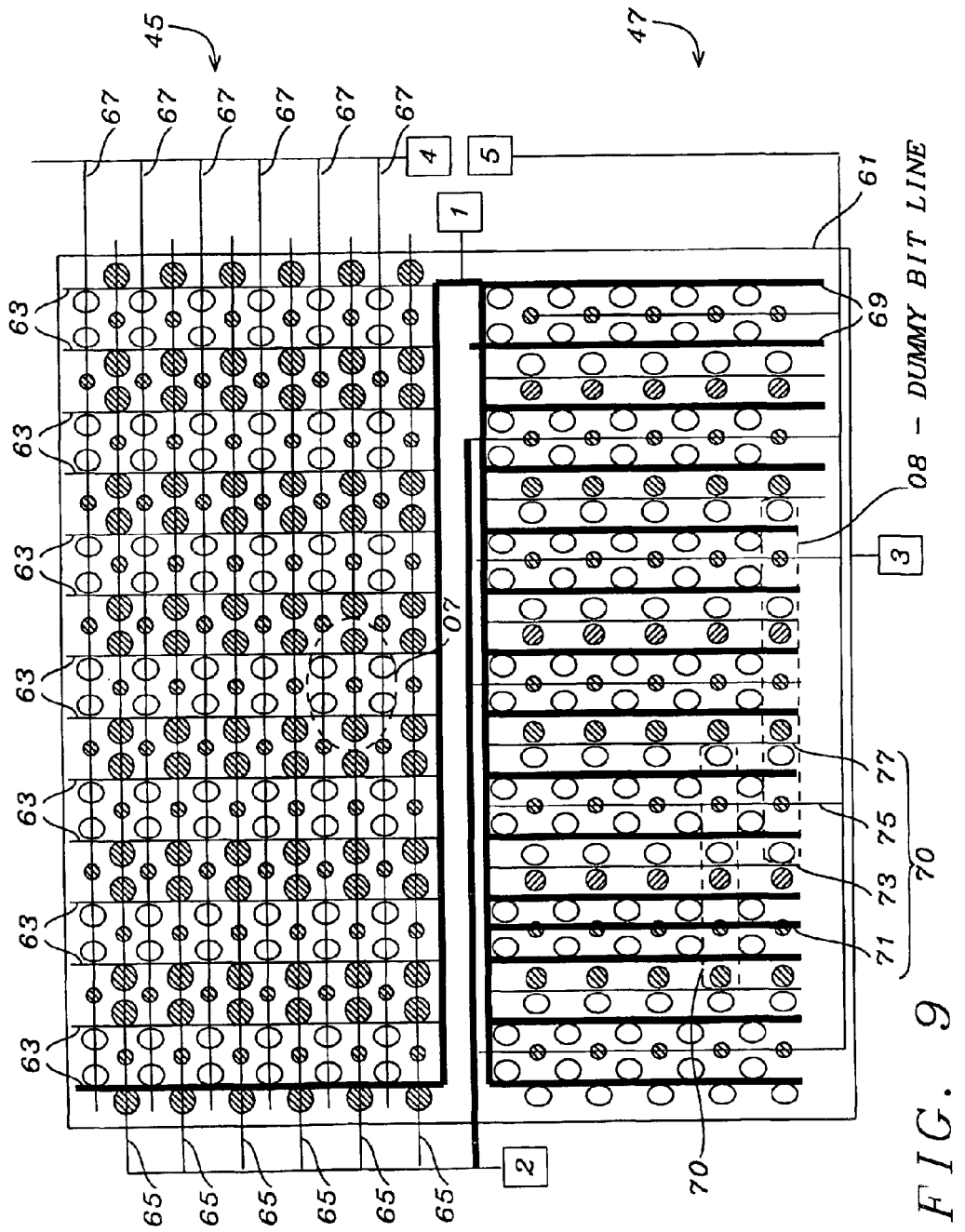
FIG. 9 shows an interconnect scheme of a conventional DRAM cell and the special design that is provided by the invention for measurement of leakage between capacitors.

The upper portion 45 of FIG. 9 shows an interconnect scheme of a conventional DRAM cell, including the wiring that is provided for this cell. The lower portion 47 of FIG. 9 shows a top view of a modified DRAM cell of the invention, including the wiring that is provided for this cell. The modification that has been provided to the lower section 47 has previously been explained using FIGS. 5 and 6.

In FIG. 9 will be recognized:

pad 1 is connected to the word lines of both the standard DRAM cell array 45 and the modified DRAM cell array 47: the first contact pad (pad 1) is formed at the ends of a plurality of first (63) and second (69) word lines and located over field oxide in a periphery of the test structure, the first (63) and second (69) word lines now becoming programmable word lines, by virtue of having contact pads connected thereto pad 2 is connected to all the bit lines of the standard DRAM cell array 45 and to some of the bit lines of the modified DRAM cell array 47; the second contact pad (pad 2) is formed at the ends of a plurality of activating first bit lines 65 of first semiconductor devices 07 and selected second bit lines 71 of the second semiconductor device 08 and is located over field oxide in a periphery of the test structure, the activating first bit lines 65 and 71 now becoming programmable bit lines, by virtue of having contact pads connected thereto pad 3 has been provided to supply a back bias voltage (of for instance −1 volts) for both sections 45 and 47, electrically isolation these sections and preventing any current flow into the underlying substrate; the third contact pad (pad 3) is connected to the field isolation region 61 formed in the first (45) and second (47) region, the field isolation 61 now becoming a programmable field isolation, by virtue of having a contact pad connected thereto.

Further highlighted in FIG. 9 are the following elements:

07, this encircled portion of the upper part 45 of FIG. 9 corresponds with FIG. 7; it is clear that this element 07 is repeated numerous times in the top portion 45 of FIG. 9

08, this encircled portion of the lower part 47 of FIG. 9 corresponds with FIG. 8; it is clear that this element 08 is repeated numerous times in the bottom portion 47 of FIG. 9

45, this is a first region on a silicon substrate designated for a functional section of said integrated circuit, which forms a structure for electrical testing during the manufacturing of a DRAM integrated circuit 47, this is a second region on a silicon substrate designated for the structure for the measurement of leakage current between DRAM capacitors, which forms a structure for electrical testing during the manufacturing of a DRAM integrated circuit 61, a region of field isolation formed in the first and second region in a layout identical to field isolation in a functional section of the integrated circuit first semiconductor devices 07 formed in first region 45 in a layout identical to a functional section, the semiconductor devices comprising first words lines 63, in addition to first activating bit lines 65, in addition to first non-activating bit lines 67, these bit lines being buried bit lines second semiconductor devices 08 formed in the second region 47 in a layout specific to the structure for electrical testing, these second semiconductor devices comprising:

69, second word lines, the second word lines 69 being patterned over semiconductor devices 08 in a layout identical to that of first word lines 63 in the first region 45, the second word lines 69 being patterned in the second region 47 over the semiconductor devices 08 in a layout identical to that of first word lines 63 in the first region 45, the second semiconductor devices 70 further comprising second bit lines 70, the second bit lines 70 being provided in a repetitive sequence of four bit lines each sequence comprising an activating bit line 71, a dummy bit line 73, a non-activating bit line 75 and a dummy bit line 77, the second bit lines 70 being exposed bit lines in a pattern that is perpendicular with a pattern of the first bit lines 65

Further shown in FIG. 9 are:

4, a first probe pad connected to non-activating bit lines 67 provided to first semiconductor devices 07 formed in the first region 45, the non-activating bit lines 67 now becoming a point of electrical measurement, by virtue of having a first probe pad connected thereto; and 5, a second probe pad connected to the non-activating bit lines 75 provided to second semiconductor devices 08 formed in the second region 47, the non-activating bit lines 75 provided to second semiconductor devices 08 now becoming a point of electrical measurement, by virtue of having a second probe pad connected thereto.

The voltage biasing scheme of the invention can be summarized as follows and is in accordance with the previously highlighted voltage applications:

a voltage of 2.0 volts is applied to pad 1, turning on all words lines of sections 45 and 47 a voltage of 2.5 volts is applied to pad 2, providing 2.5 volts to the bit liens of upper section 45 and a voltage of 2.5 to selected bit lines of lower section 47 a voltage of −1.0 volts is applied to pad 3.

Pads 4 and 5 are used to measure leakage current in accordance with the diagrams that have previously been explained using FIGS. 7 and 8.

From this it can be concluded that:

if a current is measured from pad 4 to for instance ground, there exists a physical bridge between two capacitors in a diagonal direction if a current is measured from pad 5 to for instance ground, there exists a physical bridge between two capacitors in a horizontal direction.

From the above it can be concluded that the invention provides a method and means to:

measure the presence of bridging between capacitors of a DRAM cell distinguish between diagonal bridging and horizontal bridging between capacitors of a DRAM cell.

To summarize the invention: a structure for electrical testing during the manufacturing of a DRAM integrated circuit is provided, comprising:

a first region on a silicon substrate designated for a functional section of the integrated circuit a second region on a silicon substrate designated for the structure field isolation formed in the first and second region in a layout identical to field isolation in a functional section of the integrated circuit first semiconductor devices formed in the first region in a layout identical to a functional section, the semiconductor devices comprising first words lines in addition to first activating bit lines in addition to first non-activating bit lines, the bit lines being buried bit lines second semiconductor devices formed in the second region in a layout specific to the structure for electrical testing, the semiconductor devices comprising second word lines in addition to second bit lines, the second word lines patterned over the semiconductor devices in a layout identical to that of first word lines in the first region, the second bit lines provided in a repetitive sequence of four bit lines each sequence comprising an activating bit line, a dummy bit line, a non-activating bit line and a dummy bit line, the second word lines patterned in the second region over the semiconductor devices in a layout identical to that of first word lines in the first region, the second bit lines being exposed bit lines in a pattern that is perpendicular with a pattern of the first bit lines a first contact pad formed at the ends of a plurality of the first and second word lines and located over field oxide in a periphery of the test structure, the first and second word lines now becoming programmable word lines, by virtue of having contact pads connected thereto a second contact pad formed at the ends of a plurality of the activating first bit lines of the first semiconductor devices and selected second bit lines the second semiconductor devices and located over field oxide in a periphery of the test structure, the activating first bit lines selected second bit lines now becoming programmable bit lines, by virtue of having contact pads connected thereto a third contact pad connected to the field isolation formed in the first and second region, the field isolation now becoming a programmable field isolation, by virtue of having a contact pad connected thereto a first probe pad connected to the non-activating bit lines provided to first semiconductor devices formed in the first region, the non-activating bit lines now becoming a point of electrical measurement, by virtue of having a first probe pad connected thereto, and a second probe pad connected to the non-activating bit lines provided to second semiconductor devices formed in the second region, the non-activating bit lines provided to second semiconductor devices now becoming a point of electrical measurement, by virtue of having a second probe pad connected thereto.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A structure for electrical testing during the manufacturing of a DRAM integrated circuit comprising:

a first region on a silicon substrate designated for a functional section of said integrated circuit;

a second region on a silicon substrate designated for said structure;

first semiconductor devices formed in said first region, said semiconductor devices comprising first words lines in addition to first activating bit lines in addition to first non-activating bit lines;

second semiconductor devices formed in said second region, said semiconductor devices comprising second word lines in addition to second bit lines, said second word lines patterned over said semiconductor devices in a layout identical to that of first word lines in said first region, said second bit lines provided in a repetitive sequence of four bit lines each sequence comprising an activating bit line, a dummy bit line, a non-activating bit line and a dummy bit line, said second word lines patterned in said second region over said semiconductor devices in a layout identical to that of first word lines in said first region, said second bit lines being exposed bit lines in a pattern that is perpendicular with a pattern of said first bit lines;

a first contact pad formed at the ends of a plurality of said first and second word lines;

a second contact pad formed at the ends of a plurality of said activating first bit lines of said first semiconductor devices;

a first probe pad connected to said non-activating bit lines provided to said first semiconductor devices formed in said first region; and a second probe pad connected to said non-activating bit lines provided to said second semiconductor devices formed in said second region.

2. The structure of claim 1 wherein said testing is testing of electrical shorts between capacitors of said DRAM integrated circuit, said testing further differentiating between first electrical shorts occurring between capacitors in a direction that is parallel with bit lines created in said first region on a silicon substrate and second electrical shorts occurring between capacitors in a direction under an angle with bit lines created in said first region on said silicon substrate.

3. The structure of claim 1 wherein said first region on a silicon substrate designated for a functional section of said DRAM integrated circuit and said second region on said silicon substrate designated for said structure each comprise between about 50 and 5000 partially processed DRAM cells.

4. The structure of claim 1 wherein an array of capacitors forming part of said DRAM semiconductor devices comprises between about 1 and 100 columns and between about 1 and 100 rows.

5. The structure of claim 1 wherein said DRAM integrated circuit is a DRAM cell and said functional section is a portion of a cell array.

6. The structure of claim 5 wherein said cell array contains between about 50 and 5000 partially processed cells.

7. The structure of claim 5 wherein said DRAM integrated circuits are self-aligned polysilicon MOSFET devices.

* * * * *